(12) United States Patent
Na et al.

(10) Patent No.: US 12,538,655 B2
(45) Date of Patent: *Jan. 27, 2026

(54) ORGANIC LIGHT-EMITTING DIODE DISPLAY DEVICE AND MANUFACTURING METHOD THEREOF

(71) Applicant: LG Display Co., Ltd., Seoul (KR)

(72) Inventors: Hyunseok Na, Paju-si (KR); JaeJun Ahn, Gumi-si (KR); DongSeok Park, Seoul (KR); Hyoungsun Park, Seoul (KR); Heungso Ku, Cheongju-si (KR); ChangSuk Hyun, Paju-si (KR); Sanggil Kim, Paju-si (KR); Kyoungjin Ahn, Paju-si (KR); Pyungho Choi, Paju-si (KR); Hyunchyol Shin, Seoul (KR); Seongsoo Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 589 days.

This patent is subject to a terminal disclaimer.

(21) Appl. No.: 17/982,322

(22) Filed: Nov. 7, 2022

(65) Prior Publication Data

US 2023/0255059 A1    Aug. 10, 2023

(30) Foreign Application Priority Data

Feb. 8, 2022   (KR) ........................ 10-2022-0016029

(51) Int. Cl.
*H10K 59/121*   (2023.01)
*H10K 59/126*   (2023.01)
*H10K 77/10*    (2023.01)
*H10D 30/67*    (2025.01)
*H10D 86/40*    (2025.01)

(Continued)

(52) U.S. Cl.
CPC ....... *H10K 59/1213* (2023.02); *H10K 59/126* (2023.02); *H10K 77/111* (2023.02); *H10D 30/6723* (2025.01); *H10D 30/6731* (2025.01); *H10D 30/6745* (2025.01); *H10D 30/6755* (2025.01); *H10D 86/423* (2025.01); *H10D 86/60* (2025.01); *H10K 2102/311* (2023.02)

(58) Field of Classification Search
CPC ............ H10K 59/1213; H10K 59/126; H10K 77/111; H10K 2102/311; H10K 59/124; H10K 50/805; H10K 50/844; H10D 30/6723; H10D 30/6731; H10D 30/6745; H10D 30/6755; H10D 86/423; H10D 86/60; H10D 86/481
See application file for complete search history.

(56) References Cited

U.S. PATENT DOCUMENTS

2018/0175127 A1*  6/2018  Lee ....................... H10D 86/421
2019/0103052 A1*  4/2019  Okabe ....................... G09G 3/32
2020/0388784 A1* 12/2020  Kim ....................... H10K 59/121

* cited by examiner

*Primary Examiner* — Elmito Breval
(74) *Attorney, Agent, or Firm* — Fenwick & West LLP

(57) ABSTRACT

An organic light-emitting diode (OLED) display device using hybrid type thin-film transistors (TFTs) is disclosed. The OLED display device includes an etch stopper film on a semiconductor pattern to prevent over etching of the semiconductor pattern located on a lower position and source and drain electrodes are brought in direct contact with the semiconductor pattern while passing through the etch stopper film to prevent malfunction of the TFTs due to surface resistance due to the etch stopper film. Thus, characteristics of the TFTs and process stability are secured.

19 Claims, 10 Drawing Sheets

(51) Int. Cl.
*H10D 86/60* (2025.01)
*H10K 102/00* (2023.01)

ORGANIC LIGHT-EMITTING DIODE DISPLAY DEVICE AND MANUFACTURING METHOD THEREOF

CROSS REFERENCE TO RELATED APPLICATION

This application claims priority from Republic of Korea Patent Application No. 10-2022-0016029, filed on Feb. 8, 2022, which is hereby incorporated by reference in its entirety.

BACKGROUND

1. Feld of Technology

The present disclosure relates to an organic light-emitting diode (OLED) display device including hybrid type thin-film transistors (TFTs), and more particularly, to reducing over etching of a semiconductor pattern located at a lower position during a manufacturing process.

The present disclosure relates to an organic electroluminescence display device, and particularly to an organic electroluminescence display device in which an S-factor of a certain TW among a plurality of TWs may be adjusted to represent a wide range of gradation and perform a high-speed on/off operation.

2. Description of the Prior Art

In recent times, the importance of flat panel display devices has been increasing with the development of multimedia. Therefore, flat panel display devices such as a liquid crystal display device, a plasma display device, and an organic light-emitting diode (OLED) display device have been commercialized. Among such flat panel display devices, an OLED display device has a high response rate, high brightness, and a large viewing angle and thus has been widely used.

In an OLED display device, pixels are arranged in a matrix, and each of the pixels includes a light-emitting element part, a representative example of which is an organic emission layer, and a pixel circuit part, a representative example of which is a thin-film transistor (TFT). The pixel circuit part includes a plurality of T s such as a driving T that supplies driving current to operate an organic light-emitting element and a switching TFT that supplies a gate signal to the driving T.

In addition, a gate driving circuit part that supplies a gate signal to pixels may be disposed in a non-display area of the OLED display device.

In this way, a plurality of TFTs disposed in a pixel, particularly a pixel circuit part and a gate driving circuit part in a sub-pixel, perform different functions and thus electrical characteristics of the plurality of TFTs should also be different from each other. To achieve different electrical characteristics of the plurality of TFTs in the pixel, the plurality of TFTs are formed in different structures or formed of different semiconductor materials. However, in this case, semiconductor material layers are formed on different layers and exposed to different etching conditions during an etching process, thereby causing overetching of a semiconductor material layer located at a lower position. The present disclosure relates to solving the above problem and stably securing the performance of a TFT.

SUMMARY

To address the above-described problem, the present disclosure is directed to a structure that reduces over etching of a semiconductor pattern located at a lower position in each pixel and that stably secures the performance of thin-film transistors (TFTs) included in pixels.

An aspect of the present disclosure is to provide an organic light-emitting diode (OLED) display device including: a substrate including a display area and a non-display area around the display are a first thin-film transistor (TFT) disposed on the substrate, and including a first semiconductor pattern, an etch stopper film on the first semiconductor pattern, a first gate electrode, and a first source electrode and a first drain electrode connected to the first semiconductor pattern while passing through the etch stopper film; and a second TFT disposed on the substrate, and including a second semiconductor pattern, a second gate electrode, a second source electrode, and a second drain electrode, wherein the first semiconductor pattern includes a polycrystalline semiconductor pattern, and the second semiconductor pattern includes an oxide semiconductor pattern.

The first TFT may be formed in at least one of the display area and the non-display area, and the second TFT may be formed in the display area.

The first gate electrode and the second gate electrode may be formed on different layers, and a silicon nitride film and a silicon oxide film may be stacked between the first and second gate electrodes.

The first gate electrode may be disposed on the first semiconductor pattern, and the second gate electrode may be disposed on the second semiconductor pattern.

The first semiconductor pattern may include a first source region, a first drain region corresponding to the first source region, and a first channel region between the first source region and the first drain region, and the etch stopper film may be disposed on the first source region and the first drain region to cover the first source region and the first drain region.

The etch stopper film may include a contact hole having a width less than widths of the first source region and the first drain region, and the first source electrode and the first drain electrode may be in contact with the first source region and the first drain region through the contact hole.

The first TFT may be a driving TFT configured to drive sub-pixels disposed in the display area.

The second TFT may be a driving TFT configured to drive sub-pixels disposed in the display area.

In an aspect, the OLED display device may further include a first shielding pattern located below the first semiconductor pattern to completely overlap the first semiconductor pattern.

The first shielding pattern may be disposed between the substrate and the first semiconductor pattern with an insulating film between the first shielding pattern and the first semiconductor pattern.

In an aspect, the OLED display device may further include a third TFT disposed on the substrate, and including a third semiconductor pattern configured as an oxide semiconductor pattern, a third shielding pattern located below the third semiconductor pattern to completely overlap the third semiconductor pattern, a third gate electrode, a third source electrode, and a third drain electrode; and a second shielding pattern located below the second semiconductor pattern to completely overlap the second semiconductor pattern, wherein a distance between the second semiconductor pattern and the second shielding pattern is less than a distance between the third semiconductor pattern and the third shielding pattern.

The second shielding pattern may be disposed between the first gate electrode and the second semiconductor pattern.

The etch stopper film may include a wear-resistant material, and particularly, titanium nitride (TiN).

The second shielding pattern may be connected to the second gate electrode or the second drain electrode.

The first source electrode, the first drain electrode, the second source electrode, the second drain electrode, the third source electrode, and the third drain electrode may be formed of the same material.

The non-display area may further include a bending area extending from the display area, and the bending area may include openings formed by removing inorganic films stacked between the substrate, the first source electrode, and the first drain electrode to expose the substrate.

The openings may include a first opening formed by removing an inorganic film stacked between the second source electrode, the second drain electrode, and the second semiconductor pattern, and a second opening formed by removing an inorganic film stacked between the second semiconductor pattern and the substrate.

According to the present disclosure, a pixel circuit part is configured by applying thin-film transistors (TFTs) using different types of semiconductor patterns to one pixel, a semiconductor pattern located at a lower position can be prevented from being overetched during an etching process, and uniform performance of the TFTs can be achieved, thereby securing stability of the pixel circuit part.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1A:
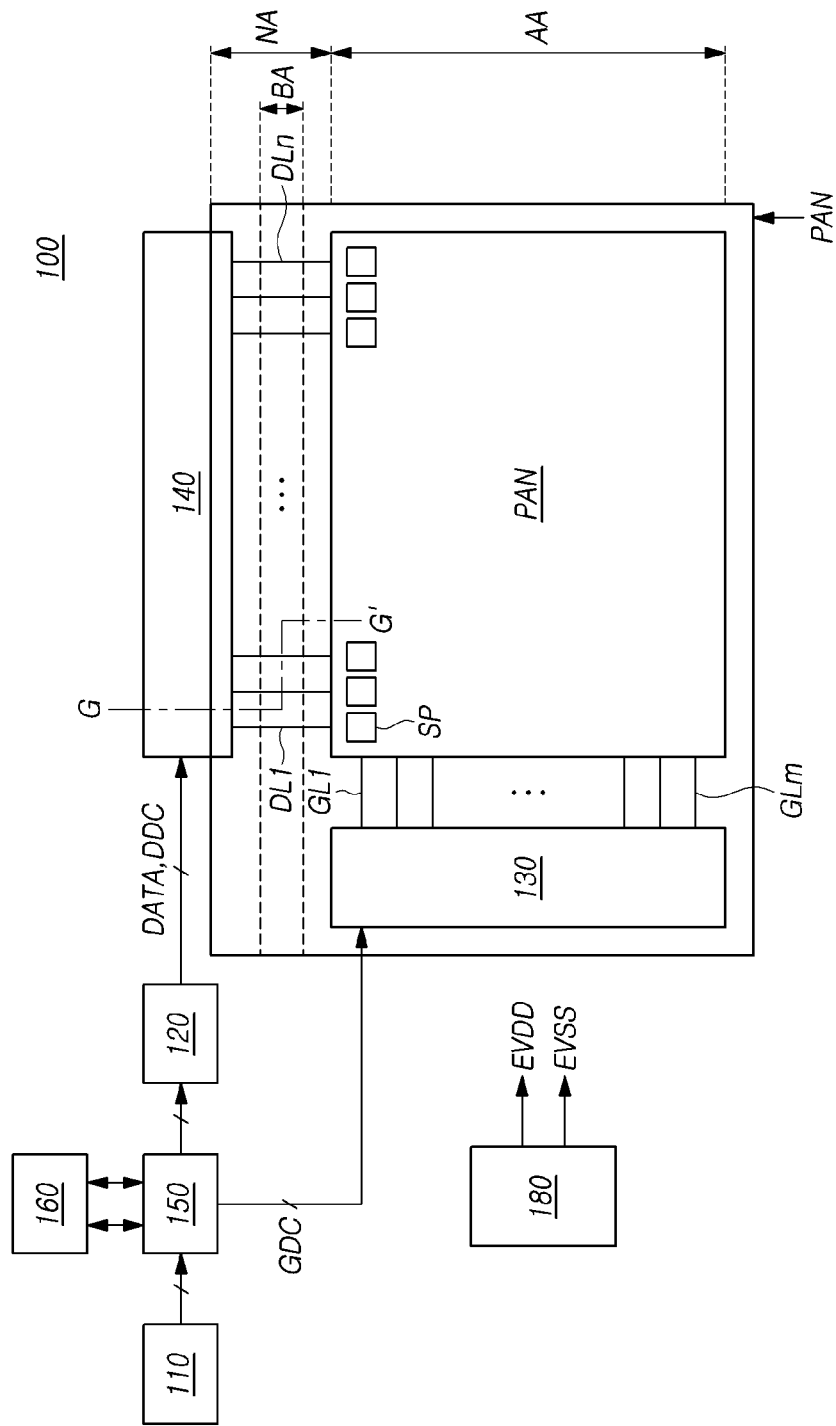
FIG. 1A is a schematic block diagram of an organic light-emitting diode (OLED) display device according to one embodiment of the present disclosure.

Advantages and features of the present disclosure and methods of achieving them will be apparent from embodiments described below in detail in conjunction with the accompanying drawings. However, the present disclosure is not limited to the embodiments set forth herein and may be embodied in many different forms. The embodiments are merely provided so that this disclosure will be thorough and complete and will fully convey the scope of the present disclosure to those of ordinary skill in the art.

Shapes, sizes, ratios, angles, numbers, etc. shown in the drawings to describe embodiments of the present disclosure are only examples and thus the present disclosure is not limited thereto. The same reference numerals refer to the same components throughout the specification. In the following description of the present disclosure, related well-known technologies are not described in detail when it is determined that they would obscure the subject matter of the present disclosure due to unnecessary detail. It will be understood that the terms "comprise," "have," "include," etc., when used herein, include the possibility of adding other components unless "only" is used. As used herein, singular forms are intended to include plural forms as well, unless the context clearly indicates otherwise.

It will be understood that components will be interpreted as including an error range unless the context clearly indicates otherwise.

When a positional relationship between two parts is described using, for example, "on," "above," "below," "beside," or the like, one or more other parts may be positioned between the two parts, unless "immediately" or "directly" is used.

When a temporal relationship, i.e., a temporarily contextual relationship, is described using, for example, "after," "subsequent to," "next," "before," etc., such terms should be understood as including discontinuity, unless "immediately" or "directly" is used.

Although "first," "second," etc. are used herein to describe various components, the components are not limited by these terms. These terms are only used to distinguish one component from another. Therefore, a first component described below could be termed a second component without departing from the technical scope of the present disclosure.

Features of various embodiments of the present disclosure may be partially or entirely combined with each other or be implemented technically in association with each other in various ways, and the embodiments may be implemented independently or together with each other.

First Embodiment

Hereinafter, a first embodiment of the present disclosure will be described in detail with reference to the accompanying drawings.

Figure 1B:
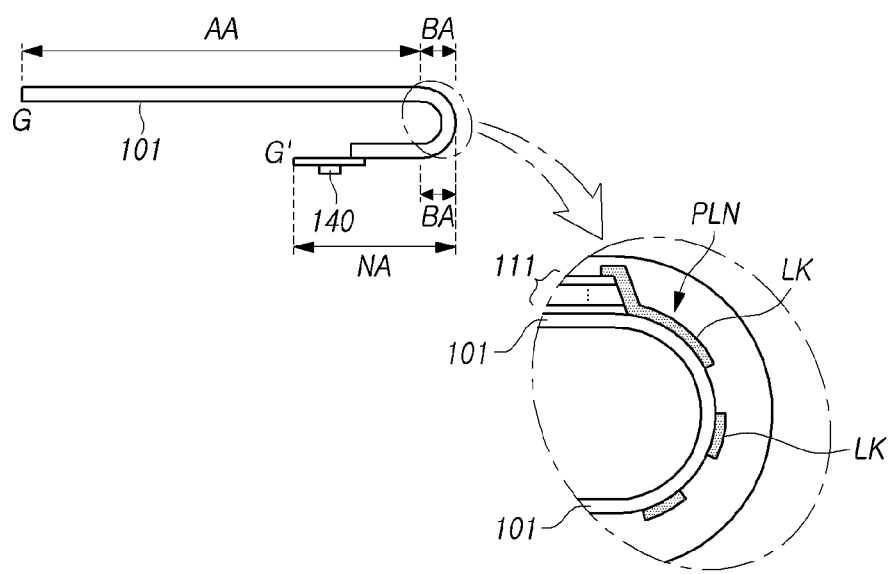
FIG. 1B is a cross-sectional view of the OLED display device along line G-G of FIG. 1A according to one embodiment of the present disclosure.
Figure 2:
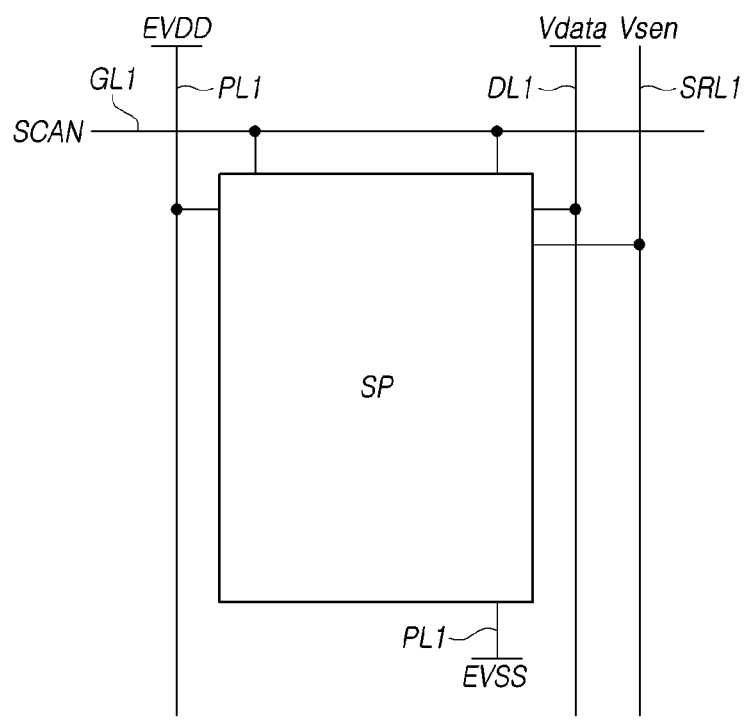
FIG. 2 is a schematic block diagram of a sub-pixel of an OLED display device according to one embodiment of the present disclosure.

FIG. 1A is a schematic block diagram of an organic light-emitting diode (OLED) display device 100 according to one embodiment of the present disclosure. FIG. 1B is a cross-sectional view of the OLED display device 100 of FIG. 1A along line G-G according to one embodiment of the present disclosure. FIG. 2 is a schematic block diagram of a sub-pixel SP shown in FIG. 1A according to one embodiment of the present disclosure.

As shown in FIG. 1A, the OLED display device 100 includes an image processor 110, a degradation compensator 150, a memory 160, a timing controller 120, a data driver 140, a power supply 180, and a display panel PAN in which a gate driver 130 is formed. In particular, a non-display area NA of the display panel PAN includes a bending area BA. The display panel PAN may be folded in the bending area BA, thus reducing a bezel size.

The image processor 110 outputs a driving signal for driving various devices, as well as image data supplied from the outside. Examples of the driving signal output from the image processor 110 may include a data enable signal, a vertical synchronization signal, a horizontal synchronization signal, a clock signal, etc.

The degradation compensator 150 (e.g., a circuit) may calculate a degradation compensation gain of a sub-pixel SP of the display panel PAN on the basis of a sensing voltage Vsen applied from the data driver 140, calculate a dimming weight on the basis of the degradation compensation gain, modulate input image data Idata of each sub-pixel SP of a current frame according to the degradation compensation gain and the dimming weight, and supply modulated image data Mdata to the timing controller 120.

The timing controller 120 is supplied with a driving signal and the like, as well as the modified image data Mdata from the degradation compensator 150. The timing controller 120 may generate and output a gate timing control signal GDC for controlling operation timing of the gate driver 130 and a data timing control signal DDC for controlling operation timing of the data driver 140, based on a driving signal input from the image processor 110.

In addition, the timing controller 120 controls the operation timings of the gate driver 130 and the data driver 140 to obtain at least one sensing voltage Vsen from each sub-pixel SP and apply the at least one sensing voltage Vsen to the degradation compensator 150.

The gate driver 130 may output a scan signal to the display panel PAN in response to the gate timing control signal GDC supplied from the timing controller 120. The gate driver 130 may output the scan signal through a plurality of gate lines GL1 to GLm. In this case, the gate driver 130 may be in the form of an integrated circuit (IC) but is not limited thereto. In particular, the gate driver 130 may be in the form of a gate-in panel (GIP) formed by directly stacking a TFT on the substrate in the OLED display device 100. The GIP may include a plurality of circuits such as a shift register and a level shifter.

The data driver 140 outputs a data voltage to the display panel PAN in response to a data timing control signal DDC input from the timing controller 120. The data driver 140 samples and latches a data signal DATA supplied in a digital form from the timing controller 120 to convert the data signal DATA into a data voltage that is in an analog form based on a gamma voltage.

The data driver 140 outputs the data voltage through a plurality of data lines DL1 to DLn.

The data driver 140 applies a sensing voltage Vsen input from the display panel PAN through a sensing voltage leadout line to the degradation compensator 150.

In this case, the data driver 140 may be mounted in the form of an integrated circuit (IC) on the display panel PAN and may be directly formed on the display panel PAN, but embodiments are not limited thereto.

The power supply 180 outputs a high-potential driving voltage EVDD, a low-potential driving voltage EVSS, etc. and supplies them to the display panel PAN. The high-potential driving voltage EVDD and the low-potential driving voltage EVSS may be supplied to the display panel PAN through a power line. In this case, a voltage output from the power supply 180 may be output to the data driver 140 or the gate driver 130 to drive the data driver 140 or the gate driver 130.

The display panel PAN displays an image corresponding to a data voltage and a scan signal supplied from the data driver 140 and the gate driver 130 that may be disposed in the non-display area NA and a voltage supplied from the power supply 180.

A display area AA of the display panel PAN comprises of a plurality of sub-pixels SP and thus an image is actually displayed thereon. The sub-pixels SP include red (R) sub-pixels, green (G) sub-pixels, and blue (B) sub-pixels or include white (W) sub-pixels, R sub-pixels, G sub-pixels and B sub-pixels. In this case, the areas of the W, R, G, and B sub-pixels may be the same or may be different from one another.

The memory 160 stores a look-up table of degradation compensation gains and a degradation compensation time of an organic light-emitting element of each sub-pixel SP. In this case, the degradation compensation time of the organic light-emitting element may be the number of times that an organic light-emitting display panel is driven or a duration during which an organic light-emitting display panel is driven.

The non-display area NA includes a bending area BA of the display panel PAN that is bendable or foldable. The bending area BA is an area that is bent to cause areas having no display function, such as a signal pad (not shown), the gate driver 130, and the data driver 140, to be located on a rear side of the display area AA. The bending area BA may be provided between the display area AA and the data driver 140 as shown in FIG. 1A. Alternatively, the bending area BA may be provided on at least one of upper, lower, left and right sides of the non-display area NA. Accordingly, a ratio of the display area AA to an entire screen of the OLED display device 100 may be maximized and the non-display area NA may be hidden behind the display area AA.

A signal link LK disposed in the bending area BA connects the signal pad and a signal line which is disposed in the display area AA. The signal link LK may extend in a direction crossing a direction of bending to increase an area, thereby minimizing bending stress.

Figure 4A:
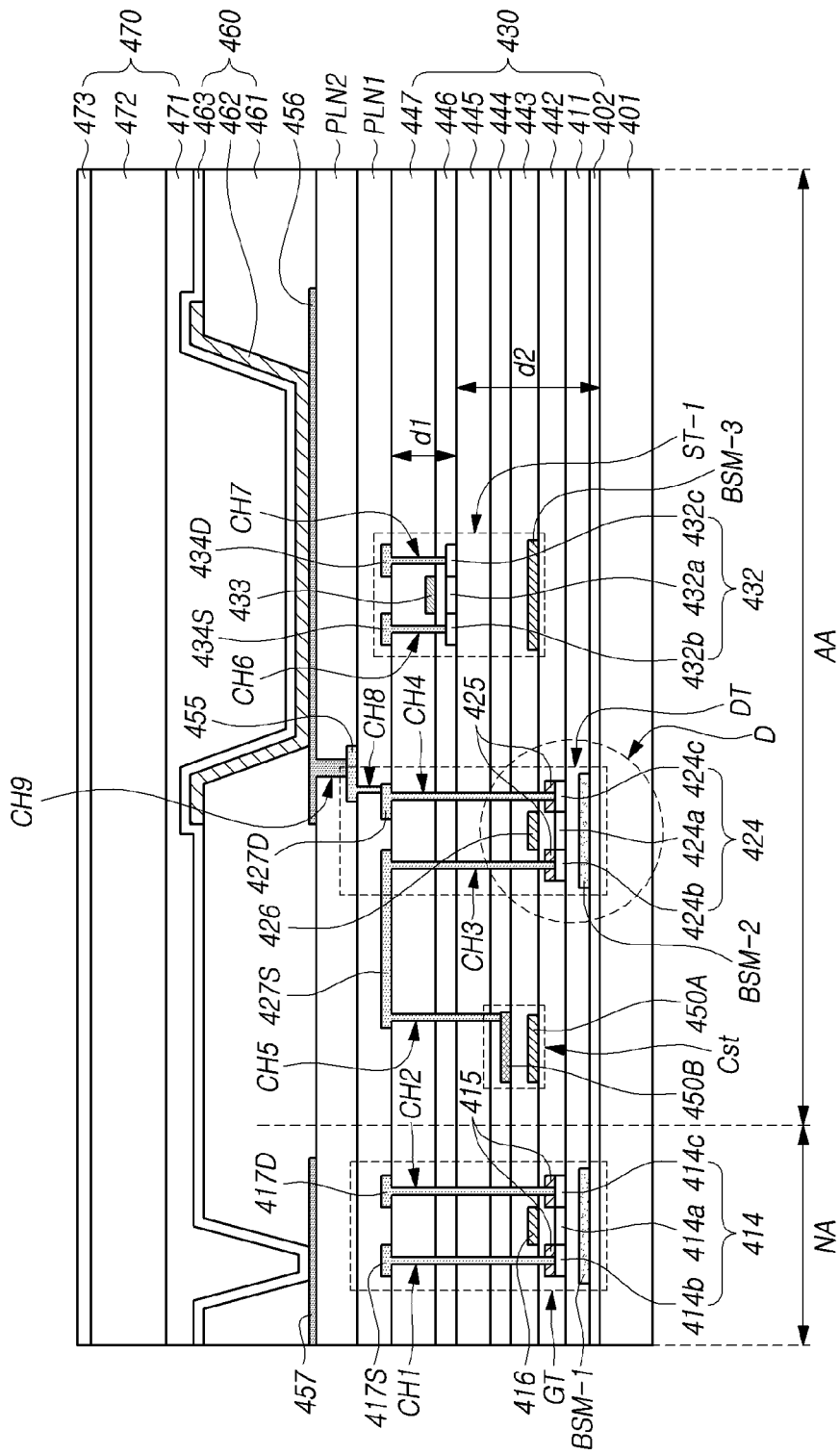
FIG. 4A is cross-sectional view of examples of a thin-film transistor (TFT) disposed on a gate driving circuit part in a non-display area and a driving TFT and a switching TFT disposed in a display area, according to a first embodiment of the present disclosure.
Figure 4B:
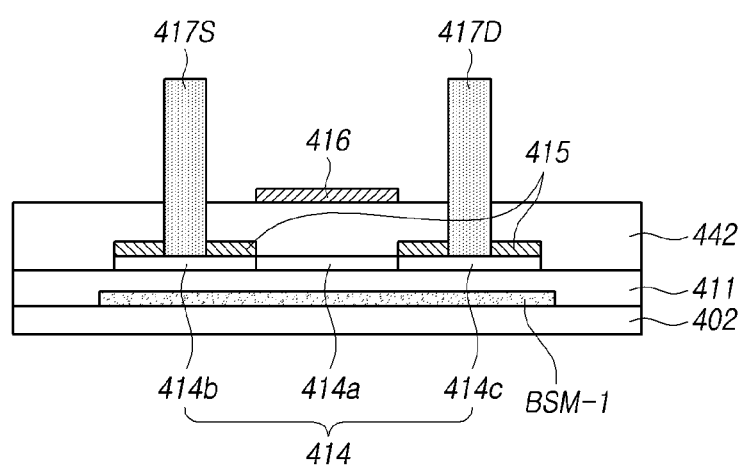
FIG. 4B is a cross-sectional view of a part of the driving TFT of FIG. 4A according to the first embodiment of the present disclosure.
Figure 4C:
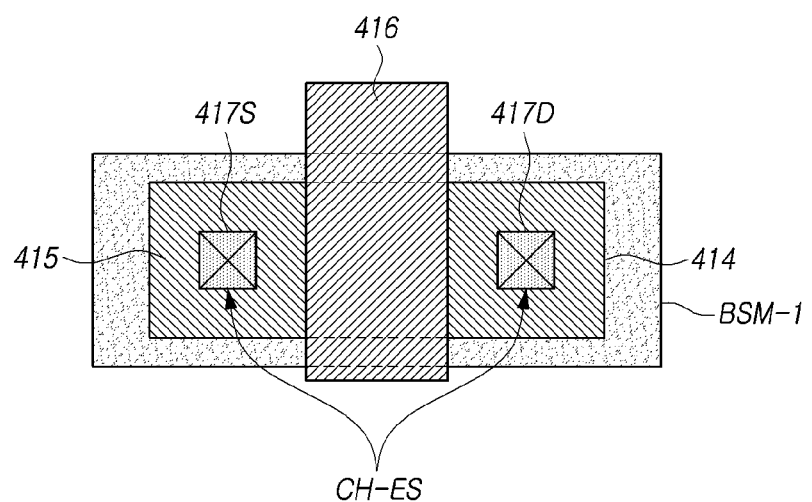
FIG. 4C is a plan view of the part of the driving TFT of FIG. 4B according to the first embodiment of the present disclosure.
Figure 4D:
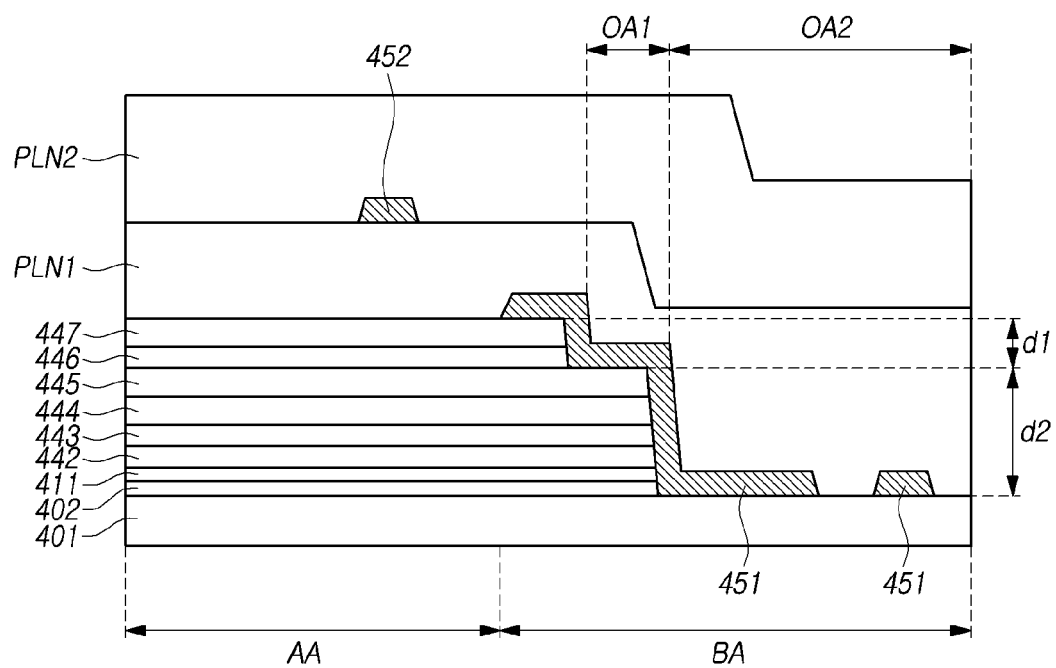
FIG. 4D is a cutaway cross-sectional view of a bending area that is a part of a non-display area according to the first embodiment of the present disclosure.

As shown in FIG. 1B, at least one opening, (e.g., openings OA1 and OA2 as shown in FIG. 4D), is provided in the bending area BA to easily bend the bending area BA. The openings OA1 and OA2 are formed by removing inorganic insulating layers 111 that are disposed in the bending area BA and that may cause cracks. Specifically, when the substrate 101 is bent, bending stress is continuously applied to the inorganic insulating layers 111 in the bending area BA. The elasticity of the inorganic insulating layers 111 is lower than that of an organic insulation material and thus cracks are likely to occur in the inorganic insulating layers 111.

Cracks occurring in the inorganic insulating layers 111 may spread to the display area AA along the inorganic insulating layers 111, thus resulting in a line defect and a defect when elements are driven. Thus, a planarization layer PLN formed of an organic insulation material more elastic than the inorganic insulating layer 111 may be disposed in at least one layer in the bending area BA. The planarization layer PLN may relieve bending stress generated when the substrate 101 is bent, thereby preventing cracks. The openings OA1 and OA2 of the bending area BA are formed by the same mask process as at least one of contact holes in the display area AA, thereby simplifying a structure and a process. In the present disclosure, a new structure that prevents damage to a semiconductor pattern when the openings OA1 and OA2 and at least one contact hole in the display area AA are formed is proposed. The new structure will be described in detail with reference to FIGS. 4A to 4D below.

As shown in FIG. 2, one sub-pixel SP may be connected to a gate line GL1, a data line DL1, a sensing voltage leadout line SRL1, and a power line PL1. The number of transistors, the number of capacitors, and a driving method of the sub-pixel SP are determined according to a structure of a circuit.

Figure 3:
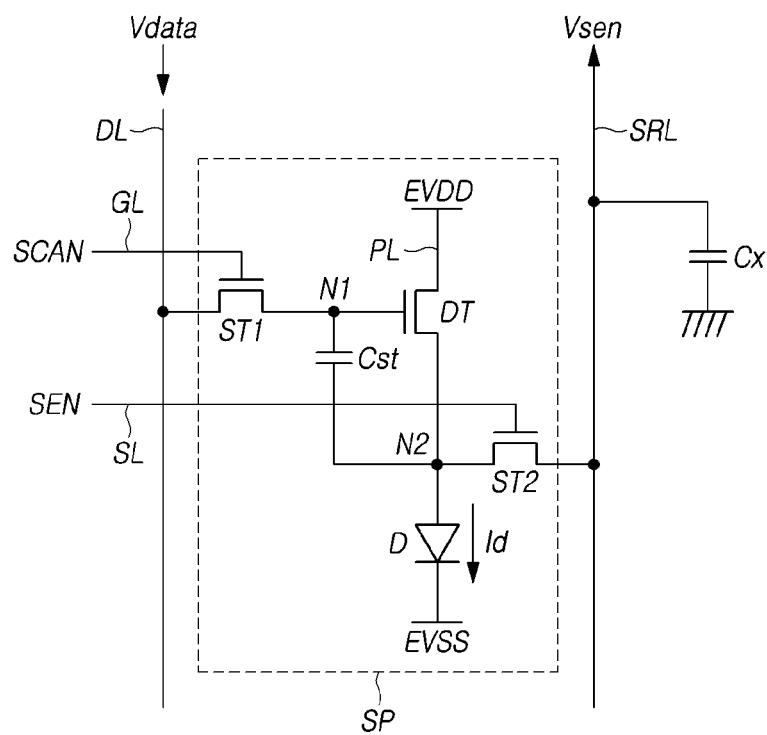
FIG. 3 is a circuit diagram of a sub-pixel of an OLED display device according to one embodiment of the present disclosure.

FIG. 3 is a circuit diagram of a sub-pixel SP of an OLED display device 100 according to one embodiment of the present disclosure.

As shown in FIG. 3, the OLED display device 100 according to the present disclosure includes a gate line GL, a data line DL, a power line PL, and a sensing line SL that cross one another to define a sub-pixel SP, and the sub-pixel SP includes a driving TFT DT, an organic light-emitting element D, a storage capacitor Cst, a first switch TFT ST1, and a second switch TFT ST2.

The organic light-emitting element D includes an anode electrode connected to a second node N2, a cathode electrode connected to an input terminal of a low-potential driving voltage EVSS, and an organic emission layer between the anode electrode and the cathode electrode.

The driving TFT DT may control a current Id flowing through the organic light-emitting element D according to a gate-source voltage Vgs. The driving TFT DT may include a gate electrode connected to a first node N1, a drain electrode which is connected to the power line PL and to which a high-potential driving voltage EVDD is applied, and a source electrode connected to the second node N2.

The storage capacitor Cst is connected between the first node N1 and the second node N2.

The first switch TFT ST1 applies a data voltage Vdata charged in the data line DL to the first node N1 to turn on the driving TFT DT in response to a gate signal SCAN when the display panel PAN is driven. In this case, the first switch TFT ST1 may include a gate electrode which is connected to the gate line GL and to which the scan signal SCAN is input, a drain electrode which is connected to the data line DL and to which the data voltage Vdata is input, and a source electrode connected to the first node N1.

The second switch TFT ST2 switches a current between the second node N2 and the sensing voltage leadout line SRL to store a source voltage of the second node N2 in a sensing capacitor Cx of the sensing voltage leadout lines SRL in response to a sensing signal SEN. The second switch TFT ST2 switches a current between the second node N2 and the sensing voltage leadout line SRL to reset a source voltage of the driving TFT DT to an initialization voltage Vpre in response to the sensing signal SEN when the display panel PAN is driven. In this case, a gate electrode of the second switch TFT ST2 is connected to the sensing line SL, a drain electrode thereof is connected to the second node N2, and a source electrode thereof is connected to the sensing voltage leadout line SRL.

Although an OLED display device having a 3T1C structure including three TFTs and one storage capacitor is illustrated as an example in the drawing, an OLED display device of the present disclosure is not limited thereto and is applicable to various structures such as a 4T1C structure, a 5T1C structure, a 6T1C structure, a 7T1C structure, and an 8T1C structure.

FIG. 4A is a cross-sectional view of a first TFT GT that is a representative example of a TFT disposed in a non-display area NA, and particularly, a GIP area, and that includes a polycrystalline semiconductor pattern, and a driving TFT DT including a polycrystalline semiconductor pattern for driving an organic electroluminescence element, a first switch TFT ST-1 including an oxide semiconductor pattern, and a storage capacitor Cst, which are disposed in a sub-pixel in a display area AA, according to a first embodiment of the present disclosure.

FIG. 4B is an enlarged view of a part of the driving TFT DT of FIG. 4A that includes a semiconductor pattern according to the first embodiment of the present disclosure, and FIG. 4C is a plan view of FIG. 4B according to the first embodiment of the present disclosure.

As shown in FIG. 4A, the driving TFT DT and a first switch TFT ST-1 are disposed in a sub-pixel on a substrate 401. In this case, although FIG. 4A illustrates only the driving TFT DT and one switching TFT ST-1 for convenience of description, actually, a plurality of switch TFTs may be disposed on the substrate 401.

In addition, a plurality of first TFT s GT of a gate driving circuit part may be disposed in a non-display area NA of the substrate 401.

In a pixel in a display area AA of the substrate 401, the driving TFT DT having the same structure as the first TFT GT may be disposed.

Hereinafter, it is assumed that the first TFT GT and the driving TFT DT, which is a second TFT, have the same structure, and the structure of the first TFT GT will be described below.

However, the first TFT GT and a second driving TFT may be doped with different types of impurities and thus may be constituted as different types of TFT such as an N-type TFT and a P-type TFT, respectively, or vice versa.

The first TFT GT includes a first polycrystalline semiconductor pattern 414 disposed on a lower buffer layer 402 on the substrate 401, a first gate insulating layer 442 for insulating the first polycrystalline semiconductor pattern 414, a first gate electrode 416 disposed on the first gate insulating layer 442 and overlapping the first polycrystalline semiconductor pattern 414, a plurality of insulating layers on the first gate electrode 416, and a first source electrode 417S and a first drain electrode 417D that are disposed on the plurality of insulating layers.

In the first TFT GT, a first shielding pattern BSM-1 may be further formed below the first polycrystalline semiconductor pattern 414 to protect the first polycrystalline semiconductor pattern 414 from light emitted from the outside. The first shielding pattern BSM-1 is not an indispensable component and thus may be optionally formed.

The first shielding pattern BSM-1 may be a metal pattern on the lower buffer layer 402. A material of the first shielding pattern BSM-1 is not limited to a thin metal film.

The first shielding pattern BSM-1 is preferably formed below the first polycrystalline semiconductor pattern 414 to be larger than the first polycrystalline semiconductor pattern 414 to completely block external light incident on the first polycrystalline semiconductor pattern 414. Therefore, the first shielding pattern BSM-1 may completely overlap the first polycrystalline semiconductor pattern 414.

The substrate 401 may be in the form of multiple layers including organic films and inorganic films that are alternately stacked. For example, the substrate 401 may be formed by alternately stacking an organic film such as polyimide and an inorganic film such as silicon oxide ($SiO_2$).

The first lower buffer layer 402 is formed on the substrate 401. The first lower buffer layer 402 is intended to block or at least reduce the penetration of moisture from the outside and may be formed by stacking silicon oxide ($SiO_2$) in multiple layers.

The first shielding pattern BSM-1 may be formed on the first lower buffer layer 402.

A second lower buffer layer 411 may be further formed on the first shielding pattern BSM-1. The second lower buffer layer 411 may be formed of the same material as the first lower buffer layer 402.

The first polycrystalline semiconductor pattern 414 is formed on the second lower buffer layer 411. The first polycrystalline semiconductor pattern 414 is formed of a polycrystalline semiconductor, and includes a first channel region 414a through which charges move, and a first source region 414b and a first drain region 414c provided adjacent to the first channel region 414a with the first channel region 414a therebetween. The first source region 414b and the first drain region 414c may be conductive regions formed by doping impurity ions such as phosphorus or boron in an intrinsic polycrystalline semiconductor pattern.

In particular, referring to FIGS. 4B and 4C, an etch stopper film 415 is further formed on the first polycrystalline semiconductor pattern 414 of the first TFT GT. Specifically, the etch stopper film 415 may be formed on the first source region 414b and the first drain region 414c. The etch stopper film 415 may be formed on upper surfaces of the first source region 414b and the first drain region 414c in contact with the first polycrystalline semiconductor pattern 414.

The etch stopper film 415 may be formed of a metal material that is hardly etched when the inorganic insulating films of the first lower buffer layer 402, the second lower buffer layer 422 and the interlayer insulating layers are etched. In particular, the etch stopper film 415 may be formed of a titanium compound that is hardly etched when the inorganic insulating films are dry etched, particularly titanium nitride (TiN).

Referring to the FIG. 4C, the etch stopper film 415 includes a contact hole CH-ES formed in upper ends of the first source region 414b and the first drain region 414c to partially expose the first source region 414b and the first drain region 414c.

A width of the contact hole is less than those of the first source region 414b and the first drain region 414c. Through the contact hole, the first source electrode 417S and the first drain electrode 417D are in direct contact with the first source region 414b and the first drain region 414C, respectively.

The etch stopper film 415 may be a metal material that is more resistant to dry etching than the inorganic insulating films, and in this case, ohmic contact is not formed between the etch stopper film 415 and the first source region 414b and the first drain region 414c, which are polycrystalline semiconductor patterns, thus increasing surface resistance. In this case, the reliability of the first TFT GT cannot be secured and thus a contact area between the first source electrode 417S and the first source region 414b and a contact area between the first drain electrode 417D and the first drain region 414c may be reduced to reduce surface resistance.

Referring to FIG. 4A, the first polycrystalline semiconductor pattern 414 in which the etch stopper film 415 is formed is insulated by the first gate insulating layer 442.

The first gate insulating layer 442 is formed by depositing an inorganic insulating layer such as SiO2 on all surfaces of the substrate 401 on which the first polycrystalline semiconductor pattern 414 is formed. The first gate insulating layer 442 protects and insulates the first polycrystalline semiconductor pattern 414 from the outside.

The first gate electrode 416 may be formed on the first gate insulating layer 442 to overlap the first channel region 414a of the first polycrystalline semiconductor pattern 414.

The first gate electrode 416 may be formed of a metal material. For example, the first gate electrode 416 may be a single layer or multiple layers formed of at least one of molybdenum (Mo), aluminum (Al), chromium (Cr), gold (Au), titanium (Ti), nickel (Ni), neodymium (Nd), and copper (Cu), or an alloy thereof but is not limited thereto.

A plurality of insulating layers may be formed between the first gate electrode 416, the first source electrode 417S and the first drain electrode 417D.

Referring to FIG. 4A, the plurality of insulating layers may include a first interlayer insulating layer 443 in contact with an upper side of the first gate electrode 416, and a second interlayer insulating layer 444, an upper buffer layer 445, a second gate insulating layer 446, and a third interlayer insulating layer 447 that are sequentially stacked on the first interlayer insulating layer 443.

The first source electrode 417S and the first drain electrode 417D are disposed on the third interlayer insulating layer 447. The first source electrode 417s and the first drain electrode 417d are respectively directly connected to the first source region 414b and the first drain region 414c through a first contact hole CH1 and a second contact hole CH2 that pass through the first gate insulating layer 442, the first interlayer insulating layer 443, the second interlayer insulating layer 444, the upper buffer layer 445, the second gate insulating layer 446, and the third interlayer insulating layer 447.

Therefore, the first source electrode 417S and the first drain electrode 417D are in direct contact with the first source region 414b and the first drain region 414c, respectively, and thus a contact area between the first source electrode 417S and the first source region 414b and a contact area between the first drain electrode 417D and the first drain region 414c may be less than when the first source electrode 417S and the first drain electrode 417D are in contact with the first source region 414b and the first drain region 414c through the etch stopper film 415, thereby reducing electrical resistance.

Meanwhile, a driving TFT DT, a first switch TFT ST-1, and a storage capacitor Cst are disposed in a sub-pixel of the display area AA.

The driving TFT DT has the same structure as the first TFT GT in the non-display area NA. However, different numerals are used herein to distinguish between components of the driving TFT DT and those of the first TFT GT.

That is, the driving TFT DT includes a second shielding pattern BSM-2 formed of the same material as the first shielding pattern BSM-1 and located on the same layer as the first shielding pattern BSM-1, a second polycrystalline semiconductor pattern 424 formed of the same material as the first polycrystalline semiconductor pattern 414 and located on the same layer as the first polycrystalline semiconductor pattern 414, an etch stopper film 425 located on a second source region 424b and a second drain region 424c of the second polycrystalline semiconductor pattern 424, a second gate electrode 426 formed of the same material as the first gate electrode 416 and located on the same layer as the first gate electrode 416, and a second source electrode 427S and a second drain electrode 427D formed of the same material as the first source electrode 417S and the first drain electrode 417D and located on the same layer as the first source electrode 417S and the first drain electrode 417D.

The second source electrode 427S and the second drain electrode 427D are directly connected to the second source region 424b and the second drain region 424C, respectively, through a third contact hole CH3 and a fourth contact hole CH4. A second channel region 424a may be disposed between the second source region 424b and the second drain region 424c.

Therefore, the first to fourth contact holes CH1 to CH4 may have the same depth.

The sub-pixel includes a first switch TFT ST-1 including an oxide semiconductor pattern. Although FIG. 4A illustrates one switching TFT, at least one switching TFT may be disposed in the sub-pixel. That is, one or more switching TFT s may be disposed according to various configurations, such as 3T1C, 4T1C, 5T1C, 6T1C, and 7T1C, of a pixel circuit of the sub-pixel.

The first switch TFT ST-1 includes a second oxide semiconductor pattern 432, a third gate electrode 433, a third source electrode 434S, and a third drain electrode 434D.

The second oxide semiconductor pattern 432 includes a third channel region 432a, and a third source region 432b and a third drain region 432c located adjacent to the third channel region 432a with the third channel region 432a therebetween.

The third gate electrode 433 is located on the second oxide semiconductor pattern 432 with the second gate insulating layer 447 therebetween.

The third source electrode 434S and the third drain electrode 434D are located on the third gate electrode 433 with the third interlayer insulating layer 447 therebetween.

The third source electrode 434S and the third drain electrode 434D are respectively connected to the third source region 432b and the third drain region 432c through a sixth contact hole CH6 and a seventh contact hole CH7 passing through the second gate insulating layer 446 and the third interlayer insulating layer 447.

A third shielding pattern BSM-3 may be disposed below the second oxide semiconductor pattern 432.

The third shielding pattern BSM-3 is disposed below the second oxide semiconductor pattern 432 while overlapping the second oxide semiconductor pattern 432 to protect the second oxide semiconductor pattern 432 from external light.

The third shielding pattern BSM-3 may be formed on the first gate insulating layer 442 or the first interlayer insulating layer 443.

Referring to FIG. 4A, the sub-pixel further includes a storage capacitor Cst.

The storage capacitor Cst may store a data voltage applied through a data line for a certain period and provide the data voltage to an organic light-emitting element.

The storage capacitor Cst may include two electrodes facing each other and a dielectric disposed between the two electrodes. The storage capacitor Cst includes a first electrode 450A formed of the same material as the first gate electrode 416 and formed on the same layer as the first gate electrode 416, and a second electrode 450B corresponding to the first electrode 450A.

The first interlayer insulating layer 443 may be disposed between the first storage electrode 450A and the second electrode 450B of the storage capacitor Cst.

The second electrode 450B of the storage capacitor Cst may be electrically connected to a second source electrode 479S.

The first embodiment of the present disclosure includes a plurality of metal patterns and a plurality of contact holes and thus it may be necessary to reduce the number of mask processes.

Thus, referring to FIG. 4A, the first shielding pattern BSM-1 and the second shielding pattern BSM-2 may be formed by one mask process using the same mask.

In addition, the first gate electrode 416, the second gate electrode 426, the first electrode 450A of the storage capacitor Cst, and the third shielding pattern BSM-3 may be formed on the same layer using the same material. That is, they may be formed by one mask process.

In addition, the first source electrode 417S, the first drain electrode 417D, the second source electrode 427S, the second drain electrode 427D, the third source electrode 434S, and the third drain electrode 434D may be formed by one mask process.

One mask process should be understood to include a photolithography process including a series of deposition, exposure, etching, and cleaning processes.

It is necessary to form the first to seventh contact holes CH1 to CH7 by one mask process, so that the first source electrode 417S, the first drain electrode 417D, the second source electrode 427S, the second drain electrode 427D, the third source electrode 434S, and the third drain electrode 434D may be formed by one mask process and connected to source and drain regions of semiconductor patterns corresponding thereto.

However, because the first polycrystalline semiconductor pattern 414 is located at a layer that is lower than the second oxide semiconductor pattern 432, when the first to seventh contact holes CH1 to CH7 are formed at the same time, the second oxide semiconductor pattern 432 is exposed to an etching gas for a longer time than the first polycrystalline semiconductor pattern 414 and thus may be damaged.

In addition, when the first to seventh contact holes CH1 to CH7 are formed, a plurality of inorganic insulating films formed in a bending area BA are also etched and removed. Therefore, the formation of the sixth and seventh contact holes CH6 and CH7 on the second oxide semiconductor pattern 432 above the first polycrystalline semiconductor pattern 414 and the formation of the first contact hole CH1 and the second contact hole CH2 may be performed separately.

This will be described in more detail with reference to FIGS. 4A and 4D below.

After the interlayer insulating layer 447 is formed, the first to seventh contact holes CH1 to CH7 should be formed to connect source and drain electrodes to semiconductor patterns. In addition, inorganic insulating layers stacked in the bending area BA should be removed.

Etching of inorganic insulating layers between the first polycrystalline semiconductor pattern 414, the first source electrode 417S, and the first drain electrode 417D includes a first operation of removing the inorganic insulating layers to a depth d1 shown in FIGS. 4A and 4D and a second operation of removing the inorganic insulating layers between the second oxide semiconductor pattern 432 and the substrate 401 to a depth d2.

That is, the second gate insulating layer 446 and the third interlayer insulating layer 447 corresponding to the depth d1 are removed in an area of the opening OA1 of the bending area BA while forming the sixth and seventh contact holes CH6 and CH7 by removing the second gate insulating layer 446 and the third interlayer insulating layer 447 in the display area AA.

Thereafter, the six and seventh contact holes CH6 and CH7 are covered with a photosensitive film or the like, and the first lower buffer layer 402, the second lower buffer layer 411, the first gate insulating layer 442, the first interlayer insulating layer 443, the second interlayer insulating layer 444, and the upper buffer layer 445 corresponding to the depth d2 are removed simultaneously in the first to fifth contact holes CH1 to cH5 and an area of the opening OA2 of the bending area BA.

In this case, when an inorganic insulating layer having the depth of d2 in the bending area BA is etched, the first polycrystalline semiconductor pattern 414 may be exposed to the etching gas for a relatively long time and thus may be damaged. However, according to the present disclosure, the etch stopper film 415 is formed on the first polycrystalline semiconductor pattern 414 to prevent damage to the first polycrystalline semiconductor pattern 414.

The etch stopper film 415 is preferably formed of a metal material that is hardly etched when inorganic insulating films are etched.

The second electrode 450B of the storage capacitor Cst of a metal material is provided below the fifth contact hole CH5 to prevent etching when the fifth contact hole CH5 is formed.

Next, after the inorganic insulating layers are removed from the first to seventh contact holes CH1 to CH7 and the bending area BA, the etch stopper film 415 is partially etched to expose the semiconductor pattern below the etch stopper film 415. In this case, the etch stopper film 415 of the metal material may be etched by wet etching.

Next, by depositing and patterning a conductive layer in the display area AA in which the contact holes are formed and the bending area BA from which the inorganic insulating layers are removed, the first source electrode 417S, the first drain electrode 417D, the second source electrode 427S, the second drain electrode 427D, the third source electrode 434S, the third drain electrode 434D, and link interconnections 451 in the bending area BA are formed simultaneously. The above process may be performed by one mask process.

Referring to FIG. 4A, a first planarization layer PLN1 is formed on the substrate 401 on which the driving TFT DT and the first switch TFT ST-1 are disposed. The first planarization layer PLN1 may be formed of an organic material such as photo acryl or may be multiple layers including an inorganic layer and an organic layer. A connection electrode 445 is formed on the first planarization layer PLN1. The connection electrode 445 electrically connects an anode electrode 456, which is a component of a light-emitting element part 460, and the driving TFT DT through an eighth contact hole CH8 formed in the first planarization layer PLN1.

A conductive film used to form the connection electrode 445 may be configured as a part of another link interconnection 452 in the bending area BA.

A second planarization layer PLN2 may be formed on the connection electrode 445. The second planarization layer PLN2 may be formed of an organic material such as photo acryl like the first planarization layer PLN1 or may be multiple layers including an inorganic layer and an organic layer.

The anode electrode 456 is formed on the second planarization layer PLN2. The anode electrode 456 is electrically connected to the connection electrode 445 through a ninth contact hole CH9 formed in the second planarization layer PLN2.

The anode electrode 456 may be a single layer or multiple layers formed of a metal such as Ca, Ba, Mg, Al, Ag or an alloy thereof, and may be connected to the second drain electrode 427D of the driving TFT DT to be applied with an image signal from the outside.

An anode connection electrode 457 that electrically connects a common voltage line VSS and a cathode electrode 463 may be further provided in the non-display area NA, as well as the anode electrode 456.

A bank layer 461 is formed on the second planarization layer PLN2. The bank layer 461 is a type of partition wall and may partition sub-pixels to prevent or at least reduce light of certain colors output from adjacent sub-pixels from being mixed and output.

An organic emission layer 462 is formed on a surface of the anode electrode 456 and some regions of an inclined plane of the bank layer 461. The organic emission layer 462 may include an R-organic emission layer emitting red light, a G-organic emission layer emitting green light, and a B-organic emission layer emitting blue light, which are each formed on a sub-pixel. Alternatively, the organic emission layer 461 may be a W-organic emission layer that emits white light.

The organic emission layer 462 may include not only emission layers but also an electron injection layer and a hole injection layer that respectively inject electrons and holes to the emission layers, and an electron transportation layer and a hole transportation layer that respectively transmit the injected electrons and holes to organic layers.

The cathode electrode 463 is formed on the organic emission layer 462. The cathode electrode 463 may be formed of a transparent conductive material such as indium tin oxide (ITO) or indium zinc oxide (IZO) or a thin metal that transmits visible light, but is not limited thereto.

An encapsulation layer part 470 is formed on the cathode electrode 463. The encapsulation part 470 may be a single layer including an inorganic layer, two layers including an inorganic layer and an organic layer, or three layers including an inorganic layer, an organic layer, and an inorganic layer. The inorganic layer may be formed of a mineral such as SiNx and SiX but is not limited thereto. The organic layer may be formed of, but is not limited to, an organic material such as polyethylene terephthalate, polyethylene naphthalate, polycarbonate, polyimide, polyethylene sulphonate, polyoximethylene, polyarylate, or a mixture thereof.

In FIG. 4A, three layers including an inorganic layer 471, an organic layer 472, and an inorganic layer 473 are provided as an example of the encapsulation layer part 470.

Cover glass (not shown) may be disposed on and attached to the encapsulation layer part 470 via an adhesive layer (not shown). A material of the adhesive layer is not limited provided that the material has good adhesion, high heat resistance, and high water resistance, but a thermosetting resin such as an epoxy compound, an acrylate compound or acrylic rubber may be used in the present disclosure. A photo curable resin may be used as the adhesive layer, in which case the adhesive layer is cured by emitting light such as ultraviolet rays to the adhesive layer.

The adhesive layer may be used to not only join the substrate 401 and the cover glass but also function as an encapsulant for preventing penetration of moisture into the OLED display device.

The cover glass is an encapsulation cap for encapsulating the OLED display device, and a protective film, such as a polystyrene (PS) film, a polyethylene (PE) film, a polyethylene naphthalate (PEN) film, or a polyimide (PI) film, or glass may be used as the cover glass.

Second Embodiment

Next, a second embodiment of the present disclosure will be described with reference to FIG. 5.

In the second embodiment, an oxide semiconductor pattern is used as a driving TFT DT for driving sub-pixels, and structures of a first TFT GT in a non-display area NA and a first switch TFT ST-1 in a sub-pixel may be the same as those in the first embodiment. Therefore, description of components that are the same as those of the first embodiment is omitted here.

In the second embodiment, a pixel circuit part 430 of a sub-pixel may include one driving TFT DT and at least one switching TFT ST. Here, when one or more switching TFT s ST are provided, all of the one or more switching TFT s ST may include an oxide semiconductor pattern or the one or more switching TFT s ST may be of a hybrid type in which some include an oxide semiconductor pattern and others include a polycrystalline semiconductor pattern.

Figure 5:
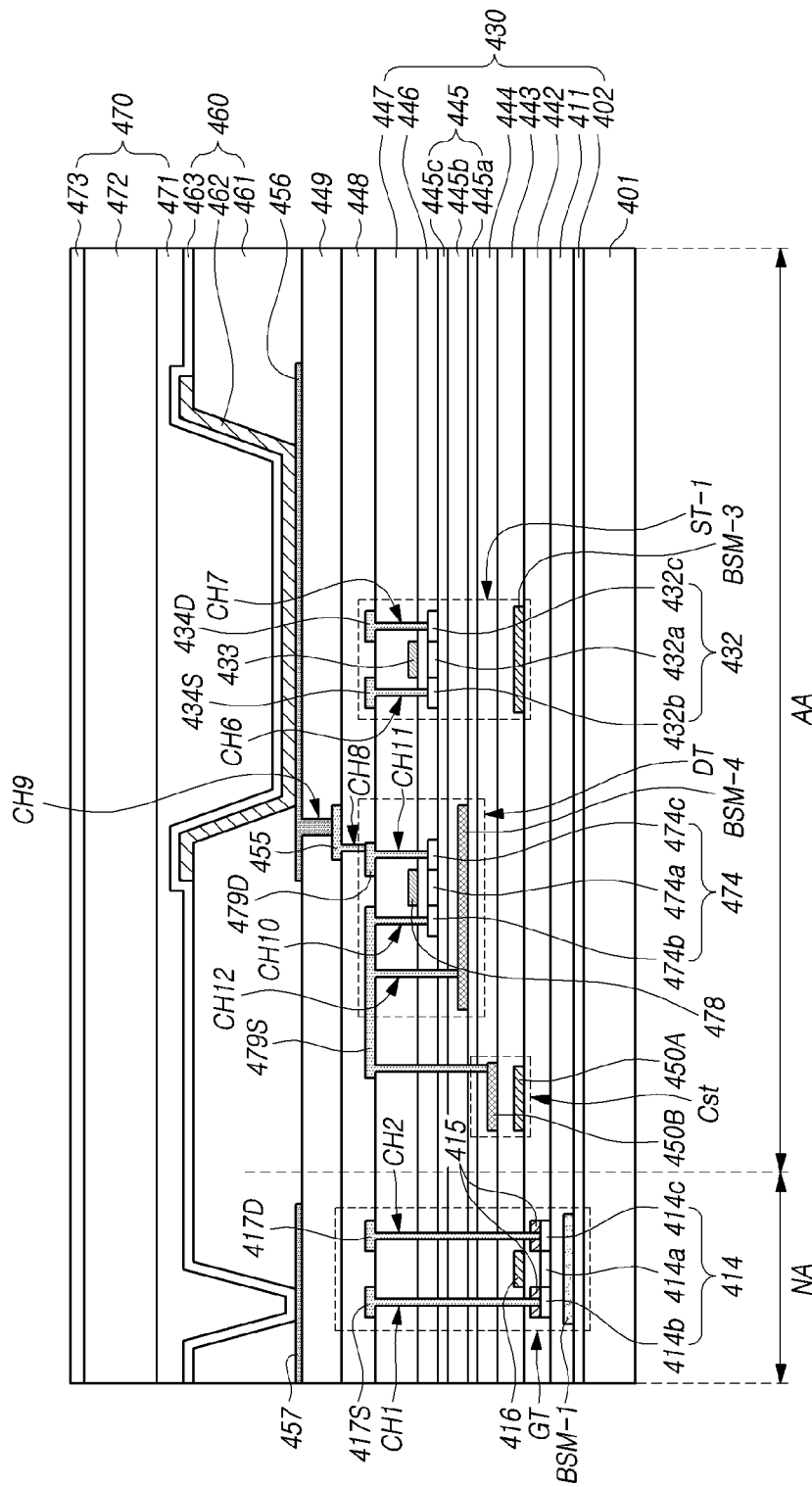
FIG. 5 is cross-sectional view of examples of a TFT disposed on a gate driving circuit part in a non-display area, and a driving TFT and a switching TFT each using an oxide semiconductor pattern and disposed in a display area, according to a second embodiment of the present disclosure.
Figure 6:
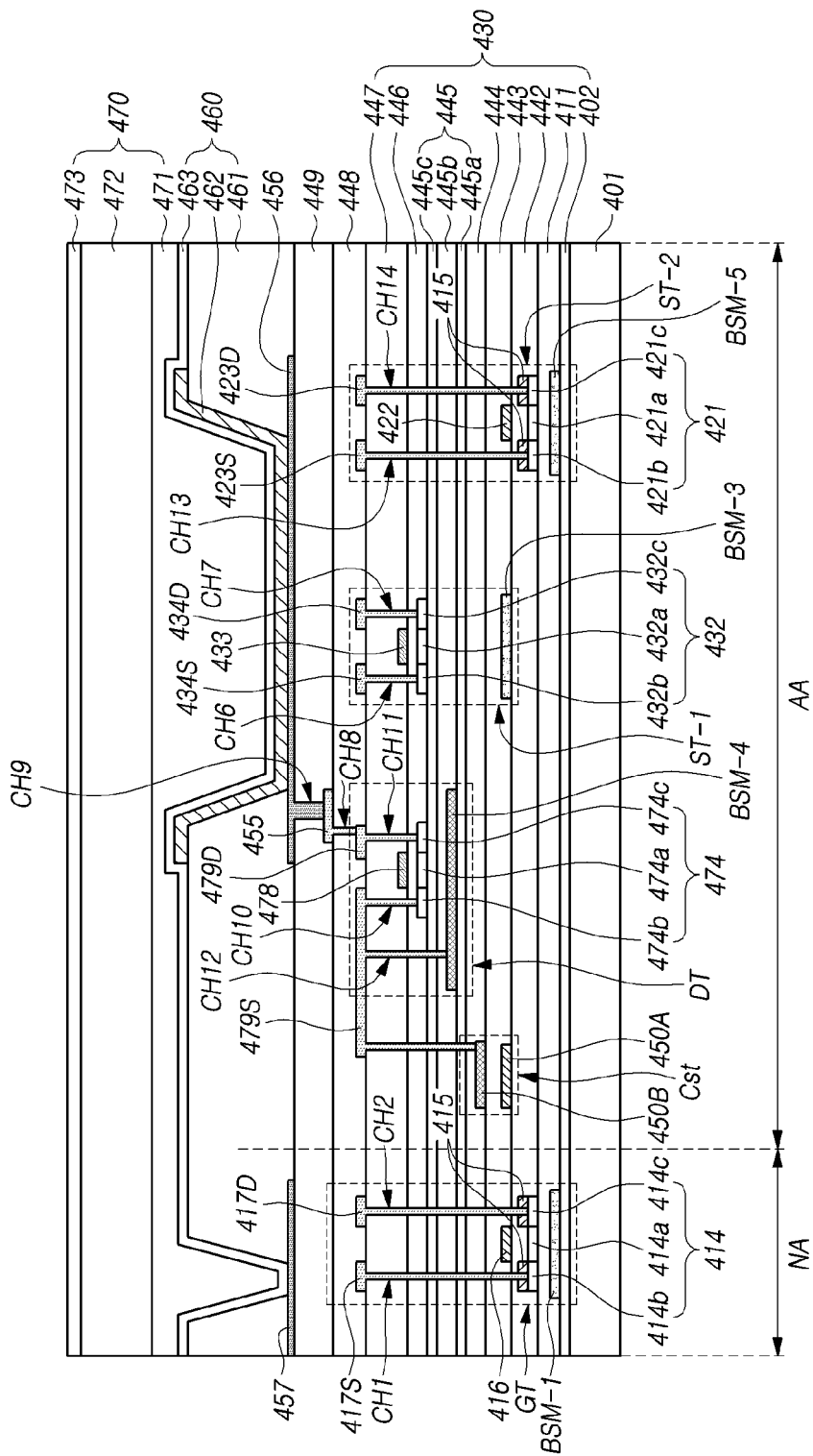
FIG. 6 is cross-sectional view of examples of a TFT disposed on a gate driving circuit part in a non-display area, a driving TFT and a switching TFT each using an oxide semiconductor pattern and disposed in a display area, and a switching TFT using a polycrystalline semiconductor pattern and disposed in the display area, according to the second embodiment of the present disclosure.

FIG. 5 illustrates, for example, a driving TFT DT including an oxide semiconductor pattern and a switching TFT including an oxide semiconductor pattern. FIG. 6 illustrates a driving TFT DT including an oxide semiconductor pattern, a switching TFT including an oxide semiconductor pattern, and a switching TFT including a polycrystalline semiconductor pattern.

Referring to FIG. 5, in the second embodiment, the driving TFT DT includes a first oxide semiconductor pattern 474, a second gate electrode 478 overlapping the first oxide semiconductor pattern 474, a second source electrode 479S, and a second drain electrode 479D.

An oxide semiconductor may include an oxide of a metal such as zinc (Zn), indium (In), gallium (Ga), tin (Sn), or titanium (Ti), or a combination of the metal and the oxide thereof. More specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like.

In the first embodiment, a polycrystalline semiconductor pattern, which is advantageous in terms of high-speed operations, is used as an active layer in a driving TFT. However, in the driving TFT including the polycrystalline semiconductor pattern, leakage current may occur in an off-state, thereby causing power consumption. In particular, power consumption in the off-state is more problematic in the case of low-speed operations, e.g., outputting a still image, e.g., a document screen, from a display device. Accordingly, in the second embodiment of the present disclosure, a driving TFT using an oxide semiconductor pattern, which is advantageous in blocking leakage current, as an active layer is proposed.

In the case of a TFT using the oxide semiconductor pattern as an active layer, a variation in a current relative to a variation in a unit voltage is large according to characteristics of a material of an oxide semiconductor and thus a defect is likely to occur in a low gradation area requiring precise control of current. Therefore, in the second embodiment, a driving TFT in which a variation in a current in the active layer relative to a variation in a voltage applied to a gate electrode is small is proposed.

Referring to FIG. 5, the driving TFT DT includes the first oxide semiconductor pattern 474 on an upper buffer layer 445, a second gate insulating layer 446 covering the first oxide semiconductor pattern 474, the second gate electrode 478 formed on the second gate insulating layer 446 and overlapping the first oxide semiconductor pattern 474, a third interlayer insulating layer 447 covering the second gate electrode 478, and the second source electrode 479S and the second drain electrode 479D on the third interlayer insulating layer 447.

The first oxide semiconductor pattern 474, which is an active layer, includes a second channel region 474a through which charges move, and a second source region 474b and a second drain region 474c located adjacent to the second channel region 474a with the second channel region 474a therebetween.

The second channel region 474a may include an intrinsic oxide semiconductor in which impurities are not doped. The second source region 474b and the second drain region 474c may be conductive areas formed by doping an intrinsic oxide semiconductor with Group IR or V impurity ions.

A fourth shielding pattern BSM-4 is formed below the first oxide semiconductor pattern 474. The fourth shielding pattern BSM-4 may be a metal pattern that blocks external light from being emitted to the first oxide semiconductor pattern 474 to prevent malfunction of the first oxide semiconductor pattern 474.

In the second embodiment, the fourth shielding pattern BSM-4 may be a metal layer including a titanium (Ti) material having a strong ability to collect hydrogen particles. For example, the fourth shielding pattern BSM-4 may be a titanium (Ti) layer, two layers including molybdenum (Mo) and titanium (Ti), or an alloy of molybdenum (Mo) and titanium (Ti). However, the fourth shielding pattern BSM-4 is not limited thereto and may be another metal layer including titanium (Ti).

Titanium (Ti) is capable of collecting hydrogen particles diffused into the upper buffer layer 445, thus preventing the hydrogen particles from reaching the first oxide semiconductor pattern 474.

The fourth shielding pattern BSM-4 is preferably formed below the first oxide semiconductor pattern 474 in a vertical direction to overlap the first oxide semiconductor pattern 474. The fourth shielding pattern BSM-4 may be formed to be larger than the first oxide semiconductor pattern 474 to completely overlap the first oxide semiconductor pattern 474.

The second source electrode 479S of the driving TFT DT may be electrically connected to the fourth shielding pattern BSM-4. When the fourth shielding pattern BSM-4 is electrically connected to the second source electrode 479S, the following effects can be obtained additionally.

In the first oxide semiconductor pattern 474, the second source region 474b and the second drain region 474c are doped with impurities and thus a parasitic capacitance Cact may occur in the first oxide semiconductor pattern 474, a parasitic capacitance Cgi may occur between the second gate electrode 478 and the first oxide semiconductor pattern 474, and parasitic capacitance Cbuf may occur between the fourth shielding pattern BSM-4 electrically connected to the second source electrode 479S and the first oxide semiconductor pattern 474.

The first oxide semiconductor pattern 474 and the fourth shielding pattern BSM-4 are electrically connected through the second source electrode 479S and thus the parasitic capacitance Cact and the parasitic capacitance Cbuf are connected in parallel and the parasitic capacitance Cact and the parasitic capacitance Cgi are connected in series. An effect voltage Veff actually applied to the first oxide semiconductor pattern 474 when a gate voltage Vgat is applied to the second gate electrode 478 may be expressed by Equation 1 below.

$$\Delta Veff = \frac{Cgi}{Cgi + Cbuf + Cact} * \Delta Vgat \quad \text{[Equation 1]}$$

Thus, the effect voltage Veff applied to the second channel region 474a is inversely proportional to the parasitic capacitance Cbuf and thus the effective voltage Veff applied to the first oxide semiconductor pattern 474 may be controlled by adjusting the parasitic capacitance Cbuf.

That is, an actual current flowing through the first oxide semiconductor pattern 474 may be reduced by disposing the fourth shielding pattern BSM-4 close to the first oxide semiconductor pattern 474 to increase the parasitic capacitance Cbuf.

A reduction of the effective current flowing through the first oxide semiconductor pattern 474 may be understood to mean that an s-factor can be increased, and that a range of controlling the driving TFT DT through the voltage Vgat actually applied to the second gate electrode 478 is large.

That is, when the second source electrode 479S of the driving TFT DT and the fourth shielding pattern BSM-4 are electrically connected, an organic light-emitting element can be accurately controlled even at low gradation, thereby preventing screen blurring that frequently occurs at low gradation.

Actually, a parasitic capacitance generated between the second shielding pattern BSM-2 and the second semiconductor pattern may be larger than a parasitic capacitance generated between the second gate electrode and the second semiconductor pattern.

For reference, the s-factor is generally called a "sub-threshold slope," represents a voltage required to increase a current tenfold, and is a reciprocal of a slope of a graph (I-V curve) of an area of a voltage equal to or less than a threshold voltage of the graph indicating characteristics of a drain current relative to a gate voltage.

It should be understood that when the s-factor is small, the slope of the graph (I-V curve) indicating the characteristics of the drain current relative to the gate voltage is large, and thus a TFT is turned on even by a low voltage, thereby improving switching characteristics of the TFT. On the other hand, a threshold voltage may be reached within a short time, thus making it difficult to sufficiently represent gradation.

It should be understood that when the s-factor is large, the slope of the graph (I-V curve) indicating the characteristics of the drain current relative to the gate voltage is small and therefore an on/off response rate of a TFT may decrease and thus the switching characteristics of the TFT decrease but the threshold voltage may be reached within a relatively long time, thus making it possible to sufficiently represent gradation.

In particular, the fourth shielding pattern BMS-4 is inserted into the upper buffer layer 445 and thus is disposed close to the second oxide semiconductor pattern 474. However, in the second embodiment, an example in which a number of sub-upper buffer layers are used is provided. That is, the upper buffer layer 445 may be a structure in which a first sub-upper buffer layer 445a, a second sub-upper buffer layer 445b, and a third sub-upper buffer layer 445c are sequentially stacked. The fourth shielding pattern BSM-4 is formed on the first sub-upper buffer layer 445a on the second interlayer insulating layer 444. The fourth shielding pattern BSM-4 is completely covered with the second sub-upper buffer layer 445b. The third sub-upper buffer layer 445c is formed on the second sub-upper buffer layer 445b.

The first sub-upper buffer layer 445a and the third sub-upper buffer layer 445c may be formed of silicon oxide (SiO2).

The first sub-upper buffer layer 445a and the third sub-upper buffer layer 445c may be formed of silicon oxide (SiO2) that does not include hydrogen particles and thus may protect an oxide semiconductor pattern, the reliability of which may be damaged due to the penetration of hydrogen particles during a heat treatment process.

In contrast, the second sub-upper buffer layer 445b may be formed of silicon nitride (SiNx) having an excellent ability to collect hydrogen particles. The second sub-upper buffer layer 445b may be partially formed on the first sub-upper buffer layer 445a to cover both upper and lateral sides of the fourth shielding pattern BSM-4, so that the fourth shielding pattern BSM-4 may be completely sealed, or may be formed on all sides of the first sub-upper buffer layer 445a on which the fourth shielding pattern BSM-4 is formed.

The ability of silicon nitride (SiNx) to collect hydrogen particles is better than that of silicon oxide (SiO2). When hydrogen particles penetrate into an oxide semiconductor pattern, a threshold voltage or channel conductivity of an oxide semiconductor may vary according to a position of the oxide semiconductor. In particular, a driving TFT directly contributes to an operation of a light-emitting element and thus it is important to secure the reliability thereof.

Therefore, in an embodiment of the present disclosure, the second sub-upper buffer layer 445b covering the fourth shielding pattern BMS-4 may be formed partially or entirely on the first sub-upper buffer layer 445a, thereby preventing damage to the reliability of the driving TFT DT due to hydrogen particles.

In the second embodiment, the fourth shielding pattern BSM-4 may be formed of a metal layer including a titanium (Ti) material having a strong ability to collect hydrogen particles. For example, the fourth shielding pattern BSM-4 may be a titanium (Ti) layer, two layers including molybdenum (Mo) and titanium (Ti), or an alloy of molybdenum (Mo) and titanium (Ti). However, the fourth shielding pattern BSM-4 is not limited thereto and may be another metal layer including titanium (Ti).

Titanium (Ti) is capable of collecting hydrogen particles diffused into the upper buffer layer 445, thus preventing the hydrogen particles from reaching the first oxide semiconductor pattern 474. Therefore, in the driving TFT DT according to an embodiment of the present disclosure, a metal layer such as titanium having the ability to collect hydrogen particles may be formed as the fourth shielding pattern BSM-4, and the fourth shielding pattern BSM-4 may be covered with a silicon nitride (SiNx) layer having the ability to collect hydrogen particles, thereby preventing damage to the reliability of the oxide semiconductor pattern due to hydrogen particles.

Because the second sub-upper buffer layer 445b is formed of a different material from the first sub-upper buffer layer 445a, i.e., a silicon nitride (SiNx) film, film separation may occur when the second sub-upper buffer layer 445b is deposited on all sides of a display area and thus the second sub-upper buffer layer 445b may be selectively formed on a desired location, i.e., on the location at which the fourth shielding pattern BSM-4 is formed, to solve this problem.

According to a function of the fourth shielding pattern BSM-4, the fourth shielding pattern BSM-4 is preferably formed below the first oxide semiconductor pattern 474 in the vertical direction to overlap the first oxide semiconductor pattern 474. The fourth shielding pattern BSM-4 may be formed to be larger than the first oxide semiconductor pattern 474 to completely overlap the first oxide semiconductor pattern 474.

In addition, in the driving TFT DT, the second gate electrode 478 is disposed on the first oxide semiconductor pattern 474. The second gate electrode 478 may overlap the second channel region 474a. The second gate insulating layer 446 is interposed between the second gate electrode 478 and the first oxide semiconductor pattern 474.

The second source electrode 479S and the second drain electrode 479D are formed on the second gate electrode 478.

The third interlayer insulating layer 447 may be interposed between the second source electrode 479S, the second drain electrode 479D, and the second gate electrode 478.

The second source electrode 479S is connected to the second source region 474b through a tenth contact hole CH10 passing through the second gate insulating layer 446 and the third interlayer insulating layer 447, and the second drain electrode 479D is connected to the second drain region 474c through an eleventh contact hole CH11 passing through the second gate insulating layer 446 and the third interlayer insulating layer 447.

Meanwhile, the second source electrode 474S may be electrically connected to the fourth shielding pattern BSM-4 through a twelfth contact hole CH12 passing through the upper buffer layer 445, the second gate insulating layer 446, and the third interlayer insulating layer 447.

In the second embodiment, the first TFT GT disposed in the non-display region NA includes a polycrystalline semiconductor pattern and is disposed closer to a substrate than an oxide semiconductor pattern, and thus is more likely to be exposed to an etching gas during the formation of contact holes. Thus, an etch stopper film 415 is disposed on the polycrystalline semiconductor pattern as in the first embodiment.

Referring to FIG. 6, when a second switch TFT ST-2 including a polycrystalline semiconductor pattern is disposed in a pixel in a display area AA, an etch stopper film 415 may also be disposed on a third polycrystalline semiconductor pattern 421 of the second switch TFT ST-2.

The second switch TFT ST-2 may have the same structure as the first TFT GT.

However, in some cases, by doping polycrystalline semiconductor patterns with different types of impurities, a TFT disposed in the non-display area NA and including a polycrystalline semiconductor pattern and a TFT disposed in the display area AA and including a polycrystalline semiconductor pattern may be configured as an N-type TFT and a P-type, respectively, or vice versa.

FIG. 6 illustrates a configuration in which a second switch TFT ST-2 including a polycrystalline semiconductor pattern is added to a sub-pixel, compared to the second embodiment of FIG. 5.

The second switch TFT ST-2 includes a third polycrystalline semiconductor pattern 421 disposed on the same layer as a first polycrystalline semiconductor pattern 414 and including a fifth channel region 421a, which is a channel region, a fifth source region 421b, and a fifth drain region 421c, a fifth gate electrode 422 overlapping the fifth channel region 421a, a fifth source electrode 423S and a fifth drain electrode 423D connected to the fifth source region 421b and the fifth drain region 421c through a thirteenth contact hole CH13 and a fourteenth contact hole CH14, respectively, a fifth shielding pattern BSM-5 disposed below the third polycrystalline semiconductor pattern 421 to protect the third polycrystalline semiconductor pattern 421 from external light, and an etch stopper film 415 disposed on the fifth source region 421b and the fifth drain region 421c.

The above description and the accompanying drawings are only intended to provide examples of the technical idea of the present disclosure, and thus various modifications or changes may be made by those of ordinary skill in the technical field to which the present disclosure pertains by combining, dividing, replacing or changing components without departing from the essential features of the present disclosure. Therefore, the embodiments set forth herein are not intended to limit the technical scope of the present disclosure but are provided to describe the technical scope of the present disclosure, and thus the technical scope of the present disclosure is not limited by the embodiments. The scope of the present disclosure should be interpreted based on the claims, and it should be understood that all technical ideas equivalent thereto fall within the scope of the present disclosure.

What is claimed is:

1. An organic light-emitting diode (OLED) display device comprising:
   a substrate comprising a display area and a non-display area at least partially around the display area;
   a first thin-film transistor (TFT) on the substrate, the first TFT including a first semiconductor pattern, an etch stopper film on the first semiconductor pattern, a first gate electrode, and a first source electrode and a first drain electrode connected to the first semiconductor pattern while passing through the etch stopper film; and
   a second thin-film transistor (TFT) on the substrate, the second TFT including a second semiconductor pattern, a second gate electrode, a second source electrode, and a second drain electrode,
   wherein the first semiconductor pattern comprises a polycrystalline semiconductor pattern, and the second semiconductor pattern comprises an oxide semiconductor pattern,
   wherein the first semiconductor pattern comprises a first source region and a first channel region,
   wherein the etch stopper film overlaps the first source region, and
   wherein the etch stopper film does not overlap the first channel region.

2. The OLED display device of claim 1, wherein the first TFT is in at least one of the display area and the non-display area, and the second TFT is in the display area.

3. The OLED display device of claim 2, wherein the second TFT comprises a driving thin-film transistor (TFT) configured to drive sub-pixels disposed in the display area.

4. The OLED display device of claim 3, further comprising:
   a second shielding pattern below the second semiconductor pattern such that the second shielding pattern overlaps the second semiconductor pattern, the second shielding pattern connected to the second source electrode or the second drain electrode;
   wherein a capacitance between the second shielding pattern and the second semiconductor pattern is greater than a capacitance between the second gate electrode and the second semiconductor pattern.

5. The OLED display device of claim 1, wherein the first gate electrode and the second gate electrode are on different layers, and a silicon nitride film and a silicon oxide film are between the first gate electrode and the second gate electrode.

6. The OLED display device of claim 1, wherein the first gate electrode is on the first semiconductor pattern, and the second gate electrode is on the second semiconductor pattern.

7. The OLED display device of claim 1, wherein the first semiconductor pattern comprises a first drain region corresponding to the first source region, and the first channel region between the first source region and the first drain region, and
the etch stopper film is on the first source region and the first drain region such that the etch stopper film covers the first source region and the first drain region.

8. The OLED display device of claim 7, wherein the etch stopper film comprises a contact hole having a width that is less than a width of the first source region and a width of the first drain region,
wherein the first source electrode and the first drain electrode are in contact with the first source region and the first drain region through the contact hole.

9. The OLED display device of claim 1, wherein the first TFT comprises a driving thin film transistor (TFT) configured to drive sub-pixels disposed in the display area.

10. The OLED display device of claim 9, further comprising:
a first shielding pattern below the first semiconductor pattern such that the first shielding pattern completely overlaps the first semiconductor pattern.

11. The OLED display device of claim 10, wherein the first shielding pattern is between the substrate and the first semiconductor pattern with an insulating film between the first shielding pattern and the first semiconductor pattern.

12. The OLED display device of claim 1, wherein the etch stopper film comprises a wear-resistant material.

13. The OLED display device of claim 12, wherein the etch stopper film comprises titanium nitride.

14. The OLED display device of claim 1, wherein the non-display area further comprises a bending area extending from the display area,
wherein the bending area comprises openings through inorganic films stacked on the substrate, the openings exposing the substrate.

15. The OLED display device of claim 14, wherein the openings comprise:
a first opening through an inorganic film stacked between the second source electrode and the second semiconductor pattern; and
a second opening through an inorganic film stacked between the second semiconductor pattern and the substrate.

16. An organic light-emitting diode (OLED) display device comprising:
a substrate comprising a display area and a non-display area at least partially around the display area;
a first thin-film transistor (TFT) on the substrate, the first TFT including a first semiconductor pattern, an etch stopper film on the first semiconductor pattern, a first gate electrode, and a first source electrode and a first drain electrode connected to the first semiconductor pattern while passing through the etch stopper film;
a second thin-film transistor (TFT) on the substrate, the second TFT including a second semiconductor pattern, a second gate electrode, a second source electrode, and a second drain electrode;
a third thin-film transistor (TFT) on the substrate, the third TFT including a third semiconductor pattern configured as an oxide semiconductor pattern, a third shielding pattern below the third semiconductor pattern such that the third shielding pattern completely overlaps the third semiconductor pattern, a third gate electrode, a third source electrode, and a third drain electrode; and
a second shielding pattern below the second semiconductor pattern such that the second shielding pattern completely overlaps the second semiconductor pattern,
wherein the first semiconductor pattern comprises a polycrystalline semiconductor pattern, and the second semiconductor pattern comprises an oxide semiconductor pattern,
wherein the first TFT is in at least one of the display area and the non-display area, and the second TFT is in the display area,
wherein the second TFT comprises a driving thin-film transistor (TFT) configured to drive sub-pixels disposed in the display area, and
wherein a distance between the second semiconductor pattern and the second shielding pattern is less than a distance between the third semiconductor pattern and the third shielding pattern.

17. The OLED display device of claim 16, wherein the second shielding pattern is between the first gate electrode and the second semiconductor pattern.

18. The OLED display device of claim 16, wherein the second shielding pattern is connected to the second source electrode or the second drain electrode.

19. The OLED display device of claim 16, wherein the first source electrode, the first drain electrode, the second source electrode, the second drain electrode, the third source electrode, and the third drain electrode comprise a same material.

* * * * *